(12) United States Patent       (10) Patent No.: US 9,228,921 B2
Yamazoe                          (45) Date of Patent:    Jan. 5, 2016

(54) ABERRATION ESTIMATING METHOD, PROGRAM, AND IMAGE-PICKUP APPARATUS

(71) Applicant: CANON KABUSHIKI KAISHA, Tokyo (JP)

(72) Inventor: Kenji Yamazoe, Berkeley, CA (US)

(73) Assignee: CANON KABUSHIKI KAISHA (JP)

( * ) Notice: Subject to any disclaimer, the term of this patent is extended or adjusted under 35 U.S.C. 154(b) by 299 days.

(21) Appl. No.: 14/021,245

(22) Filed: Sep. 9, 2013

(65) Prior Publication Data

US 2014/0071261 A1    Mar. 13, 2014

(30) Foreign Application Priority Data

Sep. 13, 2012 (JP) ................ 2012-201462

(51) Int. Cl.
  *H04N 1/04* (2006.01)
  *G02B 13/16* (2006.01)
  *G01M 11/02* (2006.01)
  *G03F 7/20* (2006.01)

(52) U.S. Cl.
  CPC ........... *G01M 11/0257* (2013.01); *G03F 7/706* (2013.01)

(58) Field of Classification Search
  None
  See application file for complete search history.

(56) References Cited

U.S. PATENT DOCUMENTS

| 2005/0083517 A1* | 4/2005 | Asad | G02B 27/0025 356/124 |
| 2007/0115457 A1* | 5/2007 | Matsuzawa | G01M 11/0264 356/124 |
| 2007/0278386 A1* | 12/2007 | Paxman | G01J 9/00 250/208.1 |
| 2013/0329122 A1* | 12/2013 | Geisler | H04N 5/23212 348/345 |
| 2015/0237270 A1* | 8/2015 | Atif | H04N 5/332 348/164 |

FOREIGN PATENT DOCUMENTS

JP   2007-163461 A   6/2007

OTHER PUBLICATIONS

Luke, et al., "Optical Wavefront Reconstruction: Theory and Numerical Methods", USA, SIAM Review, Society of Industrial and Applied Mathematics, 2002, vol. 44, p. 169-224.

Miyakawa, et al., "Iterative Procedure for In-situ Optical Testing with an Incoherent Source", Proceedings of SPIE, (USA) SPIE Press, 2010, vol. 7636, p. 76361k-1-76361k-7.

* cited by examiner

*Primary Examiner* — Allen Wong
*Assistant Examiner* — Samuel D Fereja
(74) *Attorney, Agent, or Firm* — Rossi, Kimms & McDowell LLP (57) ABSTRACT

An aberration estimating method using a steepest descent method is configured to estimate, as an aberration of a test optical system, an aberration when a predetermined evaluation function becomes less than or equal to a permissible value. The aberration estimating method comprising the step of updating the aberration with a sum of a current aberration and a first derivative of the evaluation function by the aberration when the evaluation function is larger than the permissible value. The aberration is an aberration of an entire pupil plane of the test optical system. The updating step includes calculating the first derivative by Fourier-transforming the difference instead of an integration at coordinates of respective points on an image plane of the test optical system.

16 Claims, 9 Drawing Sheets

ABERRATION ESTIMATING METHOD, PROGRAM, AND IMAGE-PICKUP APPARATUS

BACKGROUND OF THE INVENTION

1. Field of the Invention

The present invention relates to an aberration estimating method for measuring an aberration of a test optical system, a program, and an image-pickup apparatus.

2. Description of the Related Art

Several methods have conventionally been suggested each of which measures an aberration of a test optical system without a measuring device such as an interferometer and a shack-hartmann sensor. For example, D. Russell Luke, James V. Burke, Richard G. Lyon, Optical Wavefront Reconstruction: Theory and Numerical Methods, Usa, Siam Review, Society of Industrial and Applied Mathematics, 2002, Vol. 44, p. 169-224 ("Luke et al.") suggests an optimization method for estimating an aberration of a test optical system from a plurality of images acquired by changing a focus when a light source is a point light source (such as a star). R. Miyakawa, P. Naulleau, A. Zakhor, K. Goldberg, Iterative Procedure for In-situ Optical Testing with an Incoherent Source, Proceedings of Spie, (USA) Spie Press, 2010, Vol. 7636, p. 76361k-1~76361k-7 ("Miyakawa et al.") suggests a method of illuminating an object by an extensive light source, that is, a partially coherent illumination, and of estimating an aberration using the genetic simulated annealing from a plurality of images acquired by changing a focus. However, the genetic simulated annealing requires a long time for calculations. The steepest descent method configured to search for a minimum value of a function from a slope of the function (first derivative) is known as a relatively fast optimization method. Japanese Patent Laid-Open No. ("JP") 2007-163461 suggests a method for estimating an aberration of a test optical system by illuminating an object by a partially coherent illumination, and using the steepest descent method based on positional shifts of a plurality of images acquired by changing a focus. However, the estimation accuracy decreases when an aberration is estimated only from the positional shift.

Each of the above prior art references requires a long time for calculations, and it is difficult to quickly and precisely measure an aberration of a test optical system.

SUMMARY OF THE INVENTION

The present invention provides an aberration estimating method for quickly and precisely measuring an aberration of a test optical system, a program, and an image-pickup apparatus.

An aberration estimating method according to the present invention uses a steepest descent method. The aberration estimating method is configured to estimate, as an aberration of a test optical system, an aberration when an evaluation function becomes less than or equal to a permissible value. The evaluation function is expressed by a square sum of a difference between a first image acquired by photoelectrically converting an optical image of an object formed by the test optical system and a second image estimated when the aberration is provided to the test optical system. The aberration estimating method includes the step of updating the aberration with a sum of a current aberration and a first derivative of the evaluation function by the aberration when the evaluation function is larger than the permissible value. The aberration is an aberration of an entire pupil plane of the test optical system. The updating step includes calculating the first derivative by Fourier-transforming the difference instead of an integration at coordinates of respective points on an image plane of the test optical system.

Further features of the present invention will become apparent from the following description of exemplary embodiments with reference to the attached drawings.

DESCRIPTION OF THE EMBODIMENTS

The present embodiment is applicable to a method for estimating an aberration of a test optical system using the steepest descent method, and widely applicable to a partially coherent illumination and the like regardless of a type of light source which is not limited to a point light source. Examples of an optical device that forms an image by a partially coherent illumination include a microscope and a semiconductor exposure apparatus. It is faster than the genetic simulated annealing since the steepest descent method is used. However, this embodiment is much faster than the normal steepest descent method. In addition, since the embodiment uses the entire image, the aberration estimating accuracy is higher than the method that uses only a positional shift of an image.

The embodiment can be mathematically turned into a model, and can be implemented as a software function of a computer system. Herein, a software function of a computer system includes programming (program) including executable codes. Software codes may be executed by a general-purpose computer. Codes or related data records are stored in the general-purpose computer platform during an operation of software codes. However, in another case, software may be stored in another place, or loaded on an appropriate general-purpose computer system. Thus, software codes may be held as one or a plurality of modules by at least one machine readable medium.

Embodiments described below can be described in a format of codes described above, and may serve as one or more software products. The software code is executed by a processor (microcomputer) in a computer system. A computer platform may implement a method, a catalog, and a software download function according to this embodiment.

A description will now be given of a test optical system as an object of the aberration estimation. The test optical system is an imaging optical system configured to form an optical image of an object, and includes an image-pickup optical system for an image-pickup apparatus, a projection optical system of an exposure apparatus, and the like. First, this embodiment sets two types of coordinate systems.

A first coordinate system relates to coordinates for an object plane and an image plane, and represented by (x, y). Although a size of the object plane and a size of the image plane are different from each other by a magnification of the test optical system, a magnification of the size of an object plane is adjusted so that the size of an object plane corresponds to the size of an image plane on a one-to-one basis for simplicity purposes. Thus, the coordinate system of the object plane corresponds to the coordinate system of the image plane on a one-to-one basis.

A second coordinate system relates to coordinates of a light source plane and a pupil plane of the test optical system, and represented by (f, g). (f, g) is a coordinate system normalized so that a radius of a pupil can be 1. The object is illuminated by light from a light source, and a partially coherent illumination is used as an example in this embodiment. The partially coherent illumination is an illumination using an extensive light source. When the object is absent on the object plane, a light intensity distribution formed on a pupil of a test optical system is referred to as an effective light source, and will be represented as S(f, g). A pupil function of the test optical system is represented as P(f, g). Since influences of the aberration and polarization can be incorporated in the pupil function, the pupil function generally contains influences of the aberration and the polarization. Herein, assume that o(x, y) denotes an object including a transmittance and phase information, and I(x, y) denotes a light intensity distribution (aerial image) formed on the image plane. Illumination light is diffracted by the object. The diffracted light is defined by the pupil plane, and represented as a(f, g).

The optical image formed by the test optical system is photoelectrically converted by an image sensor, such as a CCD sensor or a CMOS sensor. Assume that $I_t(x, y, z_j)$ denotes a (first) image actually acquired by the image sensor, $z_j$ denotes a $j^{th}$ focus position, J denotes the number of images acquired by changing a defocus amount, and I(x, y, $z_j$, $\phi$) denotes a (second) image acquired through calculations on the assumption of an aberration $\phi$(f, g). Now an evaluation function F is defined as Expression 1:

$$F = \sum_{j=1}^{J}\sum_{x,y} w_j |I_t(x, y, z_j) - I(x, y, z_j, \phi)|^2 \quad \text{EXPRESSION 1}$$

The evaluation function F is made by multiplying a square of a difference between I(x, y, $z_j$, $\phi$) and $I_t(x, y, z_j)$ by a constant with a weighting function $w_j$, and summing up for each j (square sum, L2 norm). When F=0, $\phi$(f, g) can be regarded as an aberration of the test optical system. However, it is difficult to find $\phi$(f, g) that satisfies F=0. A description will now be given of a method of finding $\phi$(f, g) that satisfies F≅0 using the steepest descent method.

In the case of a coherent illumination, Expression 2 is iteratively calculated with reference to Luke et al. and reference documents cited in Luke et al. The evaluation function F may be partially differentiated by an aberration as follows by setting a point in the pupil to ($f_n$, $g_m$).

$$\phi^{k+1}(f_n, g_m) = \phi^k(f_n, g_m) + \left.\frac{\partial F}{\partial \phi}\right|_{f=f_n, g=g_m} \quad \text{EXPRESSION 2}$$

"k" denotes the number of iterative calculations, and a calculation starts with k=1. Usually, $\phi^1$(f, g)=0 may be set. Expression 2 will be expressed in more detail. When W(f, g) is an aberration caused by a defocus, and c(r) is a function which is 1 for r less than or equal to 1 and is 0 otherwise, the following Expression is established:

$$\left.\frac{\partial F}{\partial \phi}\right|_{f=f_n, g=g_m} = \quad \text{EXPRESSION 3}$$

$$\sum_{j}\sum_{x,y} w_j [I_t(x, y, z_j) - I(x, y, z_j, \phi)] \times Re[-ia(f, g)$$

$$c(\sqrt{f^2+g^2})e^{-i\phi(f_n, g_m)}e^{-iW(f_n, g_m)z_j}A(x, y)]$$

Now using FT as the notation of a Fourier transform, the following Expression is established:

$$A(x,y)=FT[a(f,g)c(\sqrt{f^2+g^2})e^{-i\phi(f_n,g_m)}e^{-iW(f_n,g_m)z_j}] \quad \text{EXPRESSION 4}$$

The iterative calculation is usually repeated 100 times to 200 times. Since Expression 2 is an expression for obtaining an aberration at one point within a pupil, it is necessary to repeat a calculation of Expression 2 at each point within the pupil to obtain the aberration of the entire pupil. Expression 2 includes Expression 3. In Expression 3, an integration at each point (x, y) on the image plane needs to be repeated J times. Thus, calculation of Expression 2 is enormous.

A description will now be given of a method for estimating an aberration based upon an image formed by a partially coherent illumination. When the partially coherent illumination is regarded as a collection of L point light sources and a position of an l-th point light source is ($f_1$, $g_1$), an image may be expressed by Expression 5.

$$I(x, y, z_j, \phi) = \quad \text{EXPRESSION 5}$$

$$\sum_{l=1}^{L} S(f_1, g_1)|FT[P(f, g, z_j, \phi)a(f - f_1, g - g_1)]|^2$$

P(f, g, $z_j$, $\phi$) is the pupil function, and the following Expression is established:

$$P(f,g,z_j,\phi)=c(\sqrt{f^2+g^2})e^{-i\phi(f,g)}e^{-iW(f,g)z_j} \quad \text{EXPRESSION 6}$$

When Expression 5 and Expression 6 are substituted into Expression 2, the aberration can be estimated based upon the image formed by the partially coherent illumination. However, the calculation needs a long time, because the calculation is repeated L times in Expression 5, which is the number of the point light sources.

Expression 2 is tentatively calculated by dividing a pupil plane into 31×31 pixels and by setting L to 373. The computational time for ten iterative calculations is 10,047 seconds (that is, when a maximum value of k is 10). When the iterative calculation is repeated 100 times, it takes about 1,000,000 seconds (corresponding to 11.5 days). The computational speed is not practical.

Accordingly, this inventor has made an improvement so as to accelerate a calculation of Expression 2.

$$\phi^{k+1}(f, g) = \phi^k(f, g) + \sum_j w_j \frac{\partial F_j}{\partial \phi} \quad \text{EXPRESSION 7}$$

$$\frac{\partial F_j}{\partial \phi} = \sum_{l=1}^{L} FT\{[I_t(x, y, z_j) - I(x, y, z_j, \phi)]A'(x, y)\} \times \quad \text{EXPRESSION 8}$$

$$Re[-iS(f_l, g_l)a(f - f_l, g - g_l)P(f, g, z_j, \phi)]$$

$$A'(x, y) = FT[a(f - f_l, g - g_l)P(f, g, z_j, \phi)] \quad \text{EXPRESSION 9}$$

In Expressions 7 to 9, the aberration $\phi(f, g)$ of the entire pupil is initially estimated instead of estimating the aberration at one point $(f_n, g_m)$ in the pupil. Further, a Fourier transform is used instead of the integration for each point $(x, y)$ on the image plane. The fast Fourier transform may be used to calculate the Fourier transform, and the computation time period is dramatically reduced. One aspect of the embodiment is to Fourier-transform a difference between the actually obtained optical image $I_t(x, y, z_j)$ and the optical image $I(x, y, z_j, \phi)$ calculated based on the estimated aberration. In addition, the weighting function is changed between the $k^{th}$ calculation and the $(k+1)^{th}$ calculation.

Effects of Expressions 7 to 9 are examined where the pupil plane is divided into 31×31 pixels and L is set to 373. The computation time for ten iterative calculations is 73 seconds. An acceleration of about 137 times is obtained.

The inventor realizes an additional acceleration. This method will be described. An eigenvalue $\Phi_l(f, g)$ and an eigenfunction $\lambda_l$ are calculated using the effective light source $S(f, g)$ and the diffracted light $a(f, g)$ of the object (Fourier transform of a complex amplitude transmittance of an object). The calculating method is described in Miyakawa et al., but will be briefly explained below. First, a function $R(f_1, g_1, f_2, g_2)$ is defined as Expression 10.

$$R(f_1, g_1, f_2, g_2) = \iint S(f,g)c(\sqrt{f^2+g^2})a^*(f_1-f, g_1-g)a(f_2-f, g_2-g)dfdg \quad \text{EXPRESSION 10}$$

"*" denotes a complex conjugate. A function having a characteristic of $R(f_1, g_1, f_2, g_2) = R^*(f_2, g_2, f_1, g_1)$ may have the following form of a Mercer series expansion.

$$R(f_1, g_1, f_2, g_2) = \sum_{i=1}^{L'} \lambda_i \Phi_i^*(f_1, g_1) \Phi_i(f_2, g_2) \quad \text{EXPRESSION 11}$$

L' is a natural number less than or equal to L. When the eigenvalue and the eigenfunction of Expression 11 are substituted into Expression 5, the optical image can be expressed as follows:

$$I(x, y, z_j, \phi) = \sum_{l=1}^{L'} \lambda_l |FT[\Phi_l(f, g)e^{-i\phi(f,g)}]|^2 \quad \text{EXPRESSION 12}$$

When an object has a small aperture such as a pinhole, $L/L' \cong 10$. More specifically, a circular pinhole may have a circular light-transmitting area of a radius is $0.5\lambda/NA$ or less. A rectangular pinhole may have a rectangular light-transmitting area of a length of a side is $\lambda/NA$ or less. When Expression 12 is used instead of Expression 5, the calculation is accelerated by L/L' times.

When polarized light is used to illuminate the object, Expression 12 may use, instead of $c(r)$, three types of pupil functions such as a pupil function corresponding to an x polarized light component, a pupil function corresponding to a y polarized light component, and a z polarized light component in response to a deflection of a light flux on the pupil plane as described in detail later.

The inventor has also found a method to converge Expression 7 stably. An aberration is used in a form of $\exp[-i\phi(f, g)]$ (for example, see Expression 6). As a characteristic of an exponential function, $\exp[-i\phi(f, g)]$ and $\exp[-i\phi(f, g)+i2s\pi]$ (s is an integer) have the same value and thus, $\phi(f, g)$ is hard to converge. When the phase unwrap is performed in or after the iterative calculation, $\phi(f, g)$ becomes likely to converge.

Figure 10A:
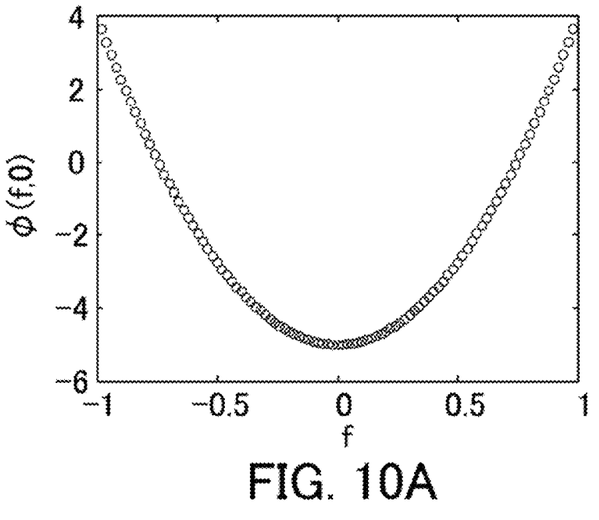
FIGS. 10A and 10B are diagrams illustrating an example of phase unwrap.

An example of the phase unwrap will be illustrated. FIG. 10A illustrates a section $\phi(f, 0)$ where $g=0$ in the aberration $\phi(f, g)$. An aberration is obtained as $\exp[-i\phi(f, g)]$. When the phase is extracted as a ratio of the real part to the imaginary part of $\exp[-i\phi(f, g)]$, a result becomes as FIG. 10B. A leap is included in data of FIG. 10B, and negatively affects a convergence of the steepest descent method. Therefore, the phase unwrap is needed. The phase unwrap involves various methods. The flood fill method is simplest, and when a phase leap is detected at adjacent data points, an integer multiple of $2\pi$ may be added. In this way, data of FIG. 10A may be acquired based upon FIG. 10B.

A description will be given of a method for determining a weighting function $w_j$ so as to more stably obtain $\phi(f, g)$. A smaller evaluation function F of Expression 1 is better, the evaluation function F is calculated by changing the weighting function $w_j$ in Expression 7, and an optimal $w_j$ is set. The evaluation function F may be approximated by a quadratic function of $w_j$ near the optimal $w_j$. Accordingly, the evaluation function F is calculated with at least three types of $w_j$, and the calculated evaluation function F is fit with a quadratic function so as to compute $w_j$ that minimizes the evaluation function F.

A more precise estimation of an aberration requires a more highly sophisticated imaged model. In particular, the precision of the imaged model can be remarkably improved by considering a polarization state of a partially coherent illumination. When illumination light is polarized, an optical image may be expressed as below:

$$I(x, y, z_j, \phi) = \quad \text{EXPRESSION 13}$$

$$\sum_{l=1}^{L} |FT[P_x(f, g, z_j, \phi)a(f - f_1, g - g_1)]|^2 +$$

$$\sum_{l=1}^{L} |FT[P_y(f, g, z_j, \phi)a(f - f_1, g - g_1)]|^2 +$$

$$\sum_{l=1}^{L} |FT[P_z(f, g, z_j, \phi)a(f - f_1, g - g_1)]|^2$$

Herein, a pupil function $P_x$ corresponding to the x polarized light component, a pupil function $P_y$ corresponding to the y polarized light component, and a pupil function $P_z$ corresponding to the z polarized light component are used in accordance with a deflection of a light flex on the pupil plane. A description will be given of $P_x$, $P_y$, and $P_z$ in detail. First, a polarization of a first point light source is expressed by the following Jones vector.

$$E_l = \begin{pmatrix} \sqrt{S(f_l, g_l)} \cos\alpha_l \\ \sqrt{S(f_l, g_l)} \sin\alpha_l \exp(i\varepsilon_l) \end{pmatrix} \quad \text{EXPRESSION 14}$$

$P_x$, $P_y$, and $P_z$ can be expressed as follows where D is a magnification of the imaging optical system.

$$\begin{pmatrix} P_x(f, g, z_j, \phi) \\ P_y(f, g, z_j, \phi) \\ P_z(f, g, z_j, \phi) \end{pmatrix} = \quad \text{EXPRESSION 15}$$

$$\begin{pmatrix} P(f, g, z_j, \phi) & 0 & 0 \\ 0 & P(f, g, z_j, \phi) & 0 \\ 0 & 0 & P(f, g, z_j, \phi) \end{pmatrix}$$

$$\begin{pmatrix} E_x^x(f, g) & E_x^y(f, g) \\ E_y^x(f, g) & E_y^y(f, g) \\ E_z^x(f, g) & E_z^y(f, g) \end{pmatrix} E_1$$

$$E_x^x(f, g) = \frac{\sqrt{\cos\theta'}}{\sqrt{\cos\theta}} (\cos\theta \cos^2\beta + \sin^2\beta) \quad \text{EXPRESSION 16}$$

$$E_y^x(f, g) = \frac{\sqrt{\cos\theta'}}{\sqrt{\cos\theta}} \sin\beta \cos\beta (\cos\theta - 1) \quad \text{EXPRESSION 17}$$

$$E_z^x(f, g) = \frac{\sqrt{\cos\theta'}}{\sqrt{\cos\theta}} \sin\theta \cos\beta \quad \text{EXPRESSION 18}$$

$$E_x^y(f, g) = \frac{\sqrt{\cos\theta'}}{\sqrt{\cos\theta}} \sin\beta \cos\beta (\cos\theta - 1) \quad \text{EXPRESSION 19}$$

$$E_y^y(f, g) = \frac{\sqrt{\cos\theta'}}{\sqrt{\cos\theta}} (\cos\theta \sin^2\beta + \cos^2\beta) \quad \text{EXPRESSION 20}$$

$$E_z^y(f, g) = \frac{\sqrt{\cos\theta'}}{\sqrt{\cos\theta}} \sin\theta \sin\beta \quad \text{EXPRESSION 21}$$

$$\sin\beta = \frac{g}{\sqrt{f^2 + g^2}} \quad \text{EXPRESSION 22}$$

$$\cos\beta = \frac{f}{\sqrt{f^2 + g^2}} \quad \text{EXPRESSION 23}$$

$$\sin\theta = NA\sqrt{f^2 + g^2} \quad \text{EXPRESSION 24}$$

$$\cos\theta = \sqrt{1 - NA^2(f^2 + g^2)} \quad \text{EXPRESSION 25}$$

$$\cos\theta' = \sqrt{1 - D^2 NA^2(f^2 + g^2)} \quad \text{EXPRESSION 26}$$

When Expression 13 is used for the steepest descent method instead of Expression 5, the aberration can be precisely estimated. In the case of non-polarized light, an optical image may be calculated with orthogonal polarized light fluxes and averaged. For example, an optical image is calculated with illuminating light as x polarized light, and then an optical image is calculated with illuminating light as y polarized light, and the calculation results are averaged so as to provide an optical image for the non-polarized light. In addition, when illumination is polarized, an eigenvalue and an eigenfunction are calculated based on Expressions 10 and 11 and an optical image can be calculated.

A limit of the partial coherence is the coherence and the incoherence. A coherent illumination is obtained by setting $S(f, g)$ to $\delta(f, g)$ where $\delta(f, g)$ is Dirac's delta function. The incoherent illumination is obtained by setting $S(f, g)$ to 1. In other words, the method according to the invention is applicable to the coherent illumination and the incoherent illumination without particularly changing the expression.

Figure 1:
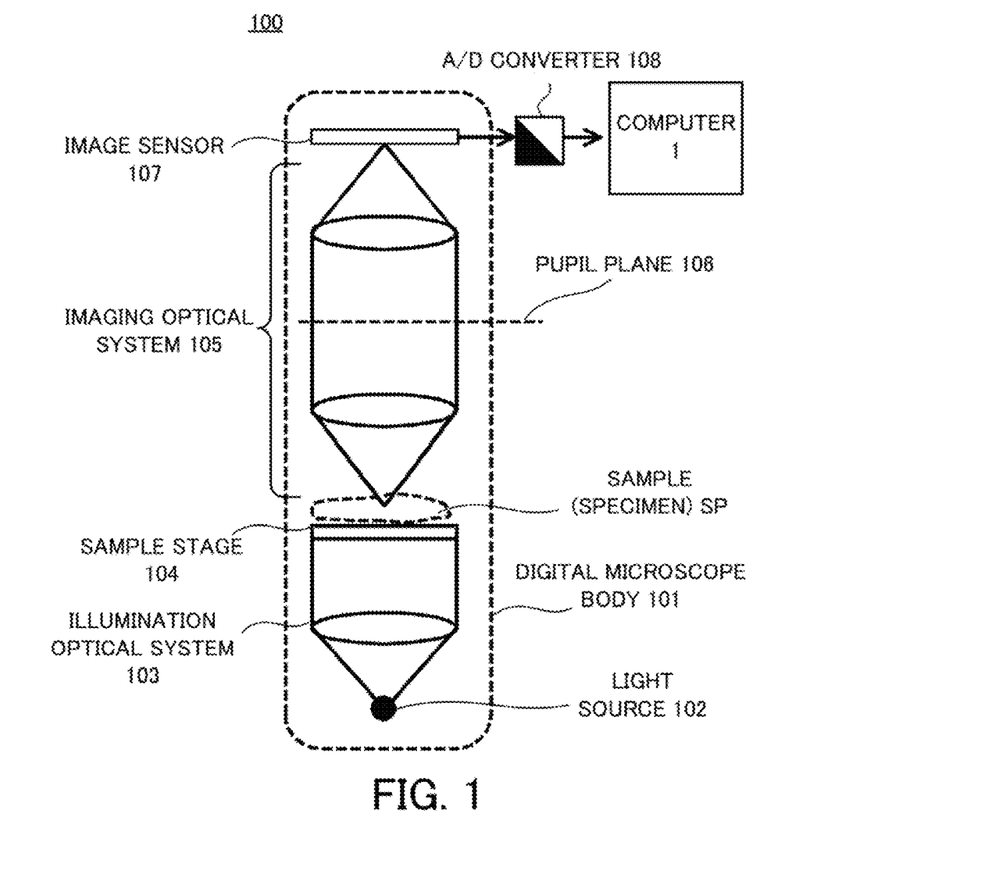
FIG. 1 is a block diagram of an image-pickup apparatus according to this embodiment.

FIG. 1 is a block diagram an illustrative configuration of a digital microscope (image-pickup apparatus) 100 according to the embodiment. The digital microscope 100 includes a digital microscope body 101, an A/D converter 108, and a computer 1.

The digital microscope body 101 includes a light source 102, an illumination optical system 103, a sample stage 104, an imaging optical system 105, and an image sensor 107.

The light source 102 emits light, and is a set of a plurality of point light sources. The illumination optical system 103 illuminates a sample (specimen) SP such as a prepared object using light from the light source 102 (partially coherent illumination). The sample SP is an object. The sample stage 104 is mounted with the sample SP and configured to move the sample SP in three axial directions. The imaging optical system 105 forms an image of the sample SP on the image plane of the image sensor 107.

The image sensor 107 is an image sensor (photoelectric conversion element) configured to photoelectrically convert the optical image of the object formed by the imaging optical system 105 to an analog electrical signal. The image sensor 107 may use a CCD (Charge Coupled Device), a CMOS (Complementary Metal Oxide Semiconductor), and the like.

The A/D converter 108 coverts the analog electrical signal from the image sensor 107 to a digital signal.

The illumination light emitted from the light source 102 passes through the illumination optical system 103, and illuminates the sample SP on the sample stage 104, and light transmitting the sample SP passes through the imaging optical system 105, and forms the image on the image plane of the image sensor 107. An epi-illumination configuration configured to illuminate the sample SP from the top, and forms an image of reflected light thereof may be used as an illumination method. The analog electrical signal output from the image sensor 107 is converted to a digital electrical signal by the A/D converter 108, and is input to the computer 1.

The computer 1 performs various types of image processing on the digital signal from the A/D converter 108, such as storing, displaying, and communicating the data, and the computer 1 of the embodiment particularly performs an aberration estimating method (aberration measuring method).

The aberration estimating method of this embodiment uses the steepest descent method. Now assume that a first image is an image obtained by photoelectrically converting an optical image of an object formed by the test optical system (imaging optical system 105) through the image sensor 107, and then by converting the result to a digital signal through the A/D converter 108. Then, the first image corresponds to $I_t(x, y, z_j)$ of Expression 1. In addition, assume that a second image is an estimated image similarly obtained when an aberration $\phi(f, g)$ is provided to the test optical system. Then, the second image corresponds to $I(x, y, z_j, \phi)$. As described above, $(f, g)$ is a coordinate on the pupil plane 106, and the aberration is an aberration of the entire pupil plane of the test optical system. An aberration $\phi(f, g)$ obtained when an evaluation function expressed by the L2 norm of a difference between the first image and the second image is less than or equal to a permissible value, is estimated as an aberration of the test optical system. $F_{min}$ described below is set as the permissible value.

Thus, the computer 1 serves as an aberration estimating apparatus (aberration measuring apparatus) configured to estimate an aberration by performing image processing for the input digital electrical signal. The aberration estimating apparatus may be configured as an independent apparatus, such as a PC, rather than a part of the image-pickup apparatus.

When the evaluation function F is not less than or equal to the permissible value, the computer 1 updates the next aberration $\phi^{k+1}$ with a sum of the current aberration $\phi^k$ and a first derivative $\partial F/\partial \phi$ with respect to an aberration $\phi$ of the evaluation function F in accordance with Expression 7. At this time, the computer 1 calculates the first derivative by a Fourier transform of the difference instead of integrating the difference with a coordinate of each point on an image plane of the test optical system. Using the Fourier transform can shorten the estimation time, and using Expression 1 with the entire image improves the aberration estimation precision in comparison with JP 2007-163461 that uses only the positional shift.

Figure 2:
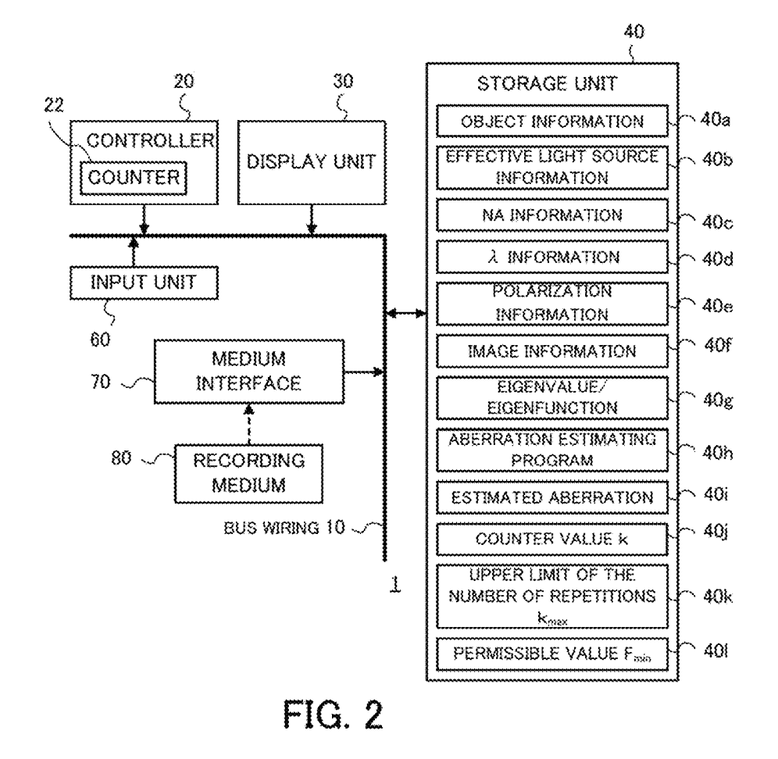
FIG. 2 is a block diagram of a computer illustrated in FIG. 1.

FIG. 2 is a block diagram of the computer 1. The computer 1 includes a bus wiring 10, a controller 20, a display unit 30, a storage unit 40, an input unit 60, and a medium interface 70. The controller 20, the display unit 30, the storage unit 40, the input unit 60, and the medium interface 70 are connected to one another through the bus wiring 10. The medium interface 70 is connectable to a recording medium 80.

For example, the controller 20 is a CPU, a GPU, a DSP (processor), or a microcomputer, and further includes a cache memory (not illustrated) for a temporary storage. A counter 22 is provided within the controller 20.

For example, the display unit 30 is a display device such as a CRT display and a liquid crystal display. For example, the storage unit 40 is a memory, a hard disk, or the like, configured to store various types of information.

The various types of information include object information 40a, effective light source information 40b, NA information 40c, $\lambda$ information 40d, polarization information 40e, image information 40f, eigenvalue/eigenfunction 40g, an aberration estimating program 40h, an estimated aberration 40i, a counter value 40j, an upper limit 40k, and a permissible value 40l.

The object information 40a is object information o(x, y) positioned on the object plane. The effective light source information 40b is information related to the intensity distribution of light formed on the pupil plane of the test optical system (the pupil plane 106 of the imaging optical system 105) when the object is absent, and means a partially coherent illumination S(f, g). The NA information 40c is information relating to an image-side numerical aperture NA of the test optical system. The $\lambda$ information 40d is information relating to an average wavelength $\lambda$ of the light source 102. The polarized light information 40e is information relating to the polarization of a partially coherent illumination formed in the illumination optical system 103. The image information 40f is information relating to an image acquired by the image sensor 107. The eigenvalue/eigenfunction 40g is information relating to the eigenvalue and eigenfunction acquired based upon the object information 40a and the effective light source information 40b. The aberration estimating program 40h is a program that enables the controller 20 of the computer 1 to execute each procedure of the aberration estimating method described below. The estimated aberration 40i is a result output by the aberration estimating program 40h, and is information relating to the aberration of the imaging optical system 105. The counter value k is a value of the counter 22, and means k of S206 which will be described later. The upper limit 40k is an upper limit $k_{max}$ of the number of repetitions used in S206 which will be described later. The permissible value 40l is a value $F_{min}$ used to determine whether the steepest descent method sufficiently converges, used in S212 which will be described later.

The input unit 60 is, for example, a keyboard or a pointing device (mouse and the like). The medium interface 70 is, for example, a CD-ROM drive or a USB interface, and is configured to connect the recording medium 80 to the bus wiring 10. The recording medium 80 is a CD-ROM, a USB memory, and the like.

Next follows a description of the aberration estimating method according to this embodiment. Assume that $\lambda$ denotes a wavelength of the partially coherent illumination, NA denotes an image-side numerical aperture of the test optical system, and $\sigma$ denotes a ratio of a numerical aperture formed by a light flux entering the object plane from the illumination optical system to an object-side numerical aperture of the test optical system. NA of the test optical system is 0.86, the wavelength $\lambda$ is 248 nm, and illumination light is non-polarized light.

Figure 3A:
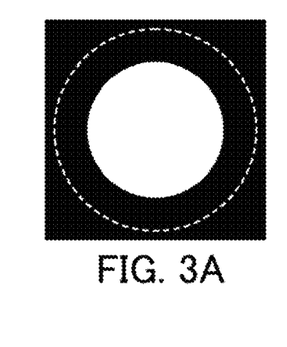
FIG. 3A is a plan view illustrating an example of an effective light source.
Figure 3B:
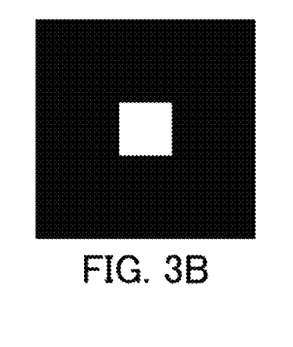
FIG. 3B is a plan view of a pinhole mask as an example of an object.

As illustrated in FIG. 3A, the effective light source is a partially coherent light source with $\sigma$ of 0.7, and the effective light source information 40b is determined. A white dotted line indicates a pupil, a solid-white part indicates a light irradiation part, and a black part indicates a light shield. As illustrated in FIG. 3B, an object is a rectangular pinhole mask with a side of 120 nm, and the object information 40a is determined. A solid-white part is a light transmitting part, and a black part is a light shielding part. The NA information 40c is set to 0.86, the $\lambda$ information 40d is set to 248 nm, and the polarized light information 40e is set to non-polarized light.

The image information 40f is acquired by moving the image sensor 107 in the optical axis direction of the test optical system. The steepest descent method requires at least one image in principle, but more images can reduce the influence of noises of the image sensor 107. In addition, it is preferable to use optical images acquired at a plurality of positions where defocus amounts have the same absolute value and different signs, and thus two images are acquired at positions defocused by ±400 nm from a best focus position in the optical axis direction.

Figure 4A:
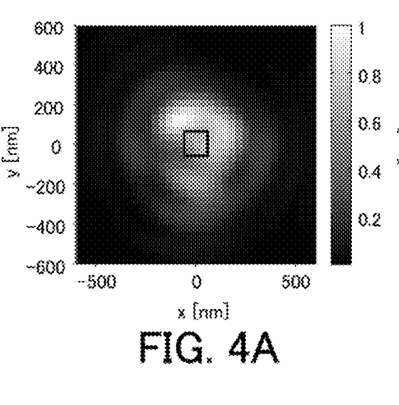
FIG. 4A is an image acquired when an image sensor is defocused from a best focus position by −400 nm.
Figure 4B:
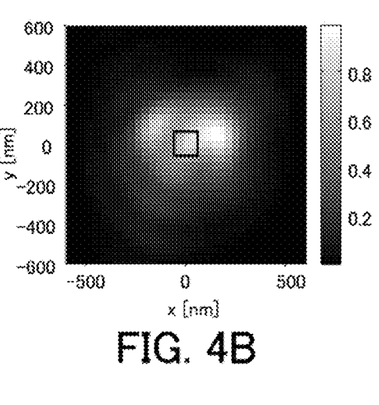
FIG. 4B is an image acquired when the image sensor is defocused from the best focus position by +400 nm.

FIG. 4A illustrates an image acquired with a defocus of −400 nm, and FIG. 4B illustrates an image acquired with a defocus of +400 nm. Each abscissa axis denotes a coordinate (nm) in the x direction, and each ordinate axis denotes a coordinate (nm) in the y direction.

Figure 5:
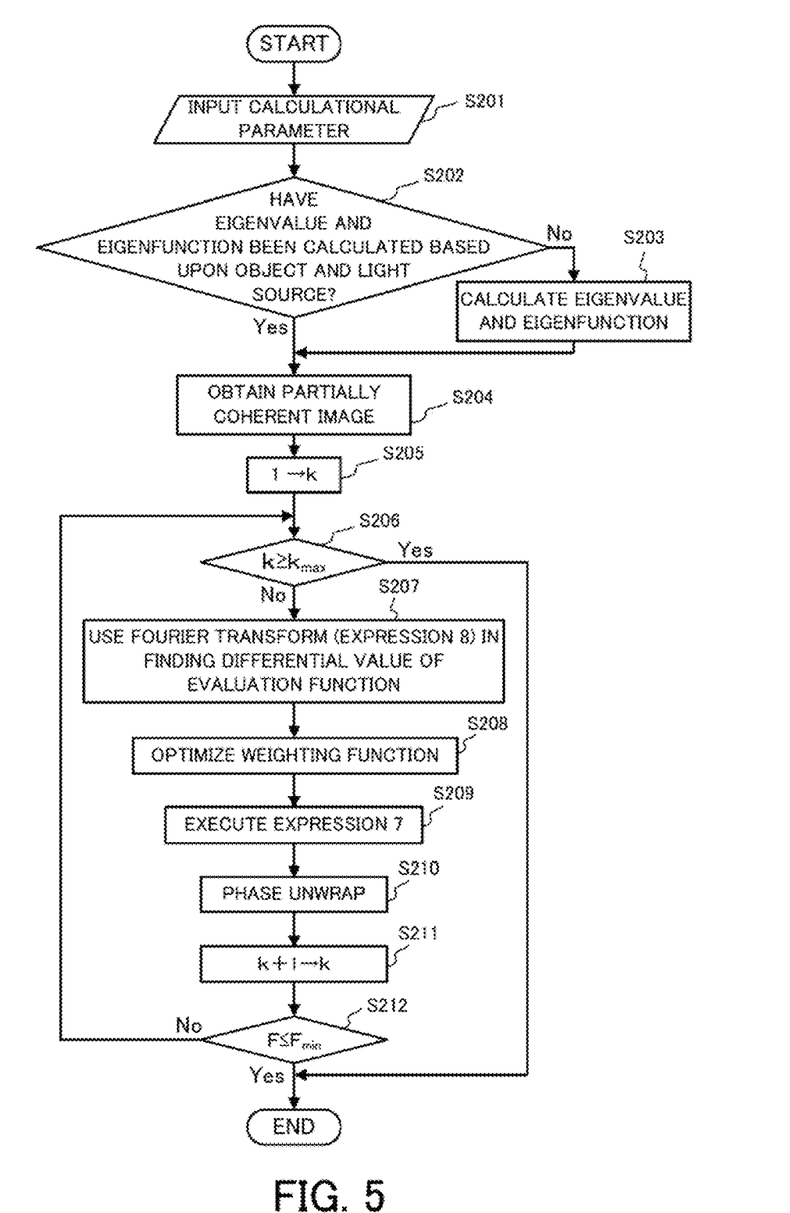
FIG. 5 is a flowchart of an aberration estimating method according to this embodiment.

FIG. 5 is a flowchart of an aberration estimating method performed by the controller 20, and "S" stands for the step (process). When a user inputs an estimation instruction of an aberration through the input unit 60, the controller 20 executes the aberration estimating program 40h.

First, the recording medium 80 in which the aberration estimating program 40h is recorded is connected to the medium interface 70, and the aberration estimating program 40h is installed in the storage unit through the controller 20. The user inputs an activation instruction of the aberration estimating program 40h to the input unit 60, and the controller 20 activates the aberration estimating program 40h with reference to the storage unit 40 in response to the input.

Next, the controller 20 acquires a calculational parameter, and stores it in the storage unit 40 (S201). Usually, the user inputs to the input unit 60 the calculational parameter and includes the object information 40a, the effective light source information 40b, the NA information 40c, the $\lambda$ information 40d, the polarized light information 40e, the upper limit 40k of the number of repetitions, and the permissible value 40l.

The controller 20 displays the parameter used to calculate the image in the display unit 30 in accordance with the aberration estimating program 40h. The controller 20 determines and saves the parameter used to calculate the image based upon the instruction.

Next, the controller 20 determines whether the eigenvalue and eigenfunction are calculated based upon the object information 40a and the effective light source information 40b with reference to the storage unit 40 (S202). When the eigenvalue and eigenfunction are not generated (No in S202), the controller 20 calculates the eigenvalue and eigenfunction based upon the object information 40a and the effective light source information 40b with reference to the storage unit 40, and stores the eigenvalue and eigenfunction in the storage unit 40 (S203).

When the eigenvalue and eigenfunction have already been generated (Yes in S202) or after S203, the controller 20 acquires the image formed by the partially coherent illumination which is acquired by the image sensor, and stores the image as the image information 40f in the storage unit 40 (S204). The user inputs to the input unit 60 an acquisition instruction of the image information 40f, and the controller 20 acquires the image (for example, FIGS. 3A and 3B) in response to the acquisition instruction, and displays the image information 40f in the display unit 30 as necessary.

The controller 20 sets the counter value k of the counter 22 indicating the number of repetitions of the steepest descent method to 1 (S205), and stores the counter value in the counter value 40j of the storage 40. Next, the controller 20 determines whether the number of repetitions of the steepest descent method reaches the predetermined number $k_{max}$ (S206). The controller 20 reads the number of repetitions k and the upper limit $k_{max}$ of the steepest descent method from the counter value 40j and the upper limit 40k of the number of repetitions in the storage unit 40, and determines whether k is greater than or equal to $k_{max}$ (S206). When k is greater than or equal to $k_{max}$ (Yes in S206), the controller 20 terminates the processing.

When k is less than $k_{max}$ (No in S206), the controller 20 differentiates the evaluation function $F_j$ for each defocus with respect to the aberration using Expression 8, and saves the first derivative $\partial F_j/\partial \phi$ in the storage unit 40 (S207).

Subsequently, the controller 20 optimizes the weighting function $w_j$ (S208). In other words, the controller 20 executes Expression 7 using at least three types of $w_j$, and calculates the evaluation function F of Expression 1 based upon an aberration obtained using each w the controller 20 calculates $w_j$ that minimizes the evaluation function F, and stores it in the storage unit 40.

Next, the controller 20 updates an aberration estimated by executing Expression 7 (S209). In other words, the controller 20 reads out of the storage unit 40 $\partial F_j/\partial \phi$ obtained in S207, and the weighting function $w_j$ obtained in S208, and executes Expression 7. An aberration thus obtained is saved in the estimated aberration 40i in the storage unit 40. In the embodiment, the object is illuminated by the partially coherent illumination formed by the plurality of point light sources and thus, S209 calculates the first derivative as a sum with respect to the respective light sources.

Figure 10B:
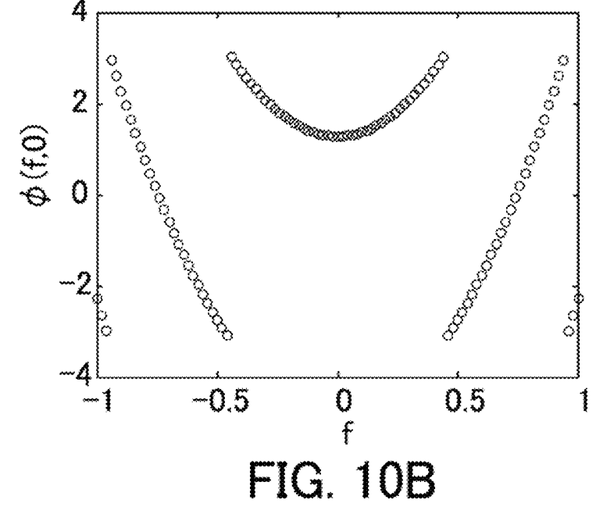

Next, the controller 20 performs phase unwrap for the aberration obtained in S209 (S210). That is, the controller 20 reads the aberration obtained in S209 out of the storage unit 40, and performs the phase unwrap. Any known means may be applied to the phase unwrap, but the flood fill method is often used in terms of the speed. The flood fill method is a method for adding an integer multiple of $2\pi$ when a phase leap is found at adjacent data points. For example, when data of FIG. 10B is unwrapped, FIG. 10A is obtained.

In S211, the controller 20 increments the counter indicating the number of repetitions of the steepest descent method by 1, and stores the counter value in the storage unit 40.

In S212, the controller 20 determines whether the evaluation function is sufficiently small. In other words, the controller 20 calculates the evaluation function F using Expression 1 based upon the estimated aberration, compares the evaluation function F with $F_{min}$ input by the user in S201, terminates the processing when F is less than or equal to $F_{min}$, and returns to S206 otherwise.

When the processing ends, the controller 20 acquires the aberration $\phi(f, g)$ given to the test optical system to acquire the second image at that time from the estimated aberration 40i in the storage unit 40, and displays the aberration $\phi(f, g)$ in the display unit 30 as necessary.

As described above, according to the processing by the aberration estimating program 40h of this embodiment, the estimated aberration 40i of the test optical system can be quickly calculated based upon the image by the partially coherent illumination.

A description will be given of various embodiments according to the invention.

First Embodiment

Assume that the NA of the test optical system is 0.86, the wavelength λ is 248 nm, the illumination light is non-polarized light, the effective light source is a partially coherent light source with σ of 0.7 as illustrated in FIG. 3A, and an aberration is estimated from images defocused by ±400 nm.

Figure 6:
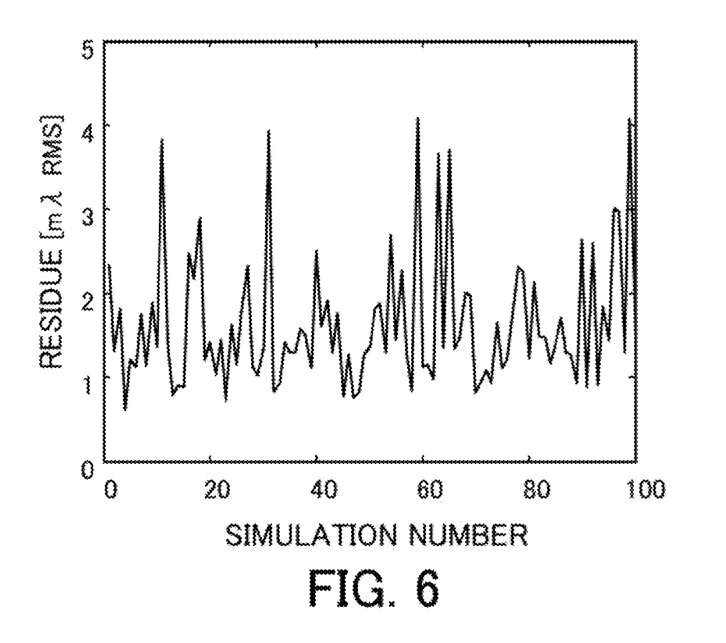
FIG. 6 is a diagram illustrating an effect of an aberration estimating method of the invention according to a first embodiment.

In order to estimate the estimation accuracy of the aberration, a procedure, in which an aberration is estimated by the aberration estimating program 40h and then a difference (residue) between an applied aberration and the estimated aberration is calculated, is repeated 100 times. Each applied aberration is randomly distributed and is normalized to 50 mλ RMS. The result is illustrated in FIG. 6. The abscissa axis denotes a simulation number, and the ordinate axis denotes the residue.

In simulating FIG. 6, the upper limit of the number of iterative calculations of the steepest descent method is set to 100. The average of residues by 100 simulations is estimated to be 1.6262 mλ RMS. It is understood that the aberration is highly precisely estimated. The standard deviation of the residue by 100 simulations is 0.7812 mλ RMS. It is understood that a solution is stably obtained. The simulation requires about 40 seconds. It is understood that the aberration can be estimated within a practical time period.

Second Embodiment

Assume that the NA of the test optical system is 0.86, the wavelength λ is 248 nm, the illumination light is non-polarized light, the effective light source is a partially coherent light source with σ of 0.7 as illustrated in FIG. 3A, and the aberration is estimated from images defocused by ±400 nm.

Figure 7A:
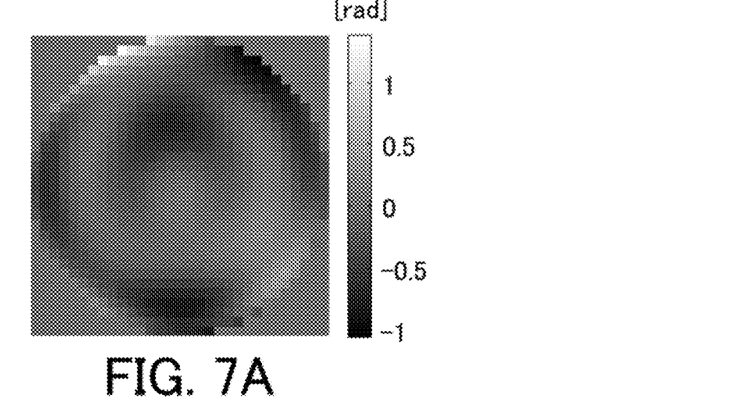
FIG. 7A is an input aberration.
Figure 7B:
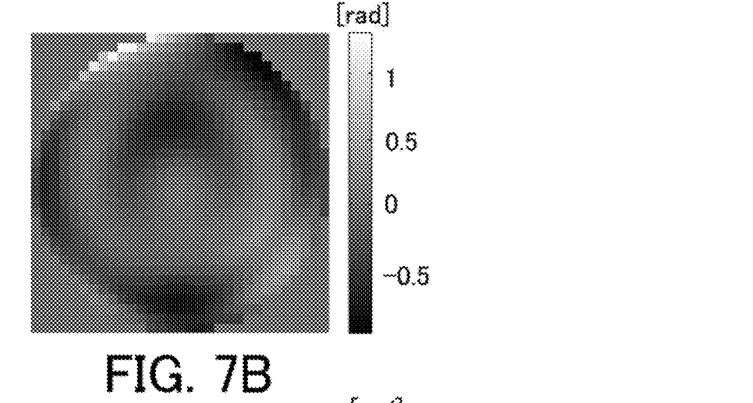
FIG. 7B is a result obtained by estimating the aberration by applying unwrap processing in accordance with S210 of FIG. 5.
Figure 7C:
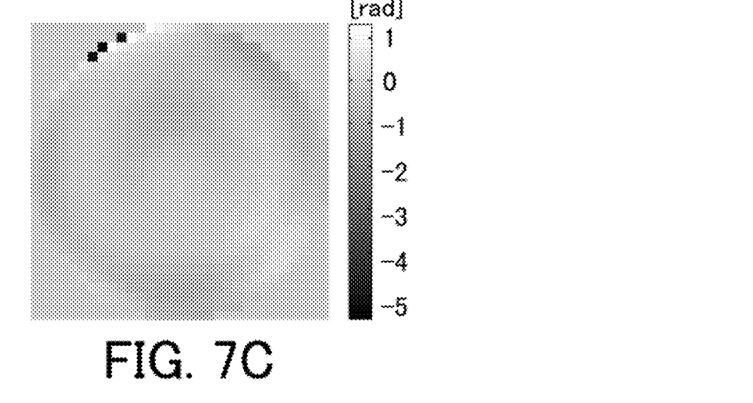
FIG. 7C is a result obtained by estimating an aberration without applying unwrap processing according to a second embodiment.

Assume that the test optical system has an aberration illustrated in FIG. 7A. FIG. 7B illustrates an aberration estimating result obtained by applying phase unwrap processing during the iterative calculation of the steepest descent method and after the iterative calculation. A difference between FIG. 7A and FIG. 7B is 1.577 mλ RMS. On the other hand, FIG. 7C illustrates an aberration estimating result obtained by using the steepest descent method without the unwrap process. A difference between FIG. 7A and FIG. 7B is 49.606 mλ RMS. It is understood that the unwrap process is effective.

Third Embodiment

Assume that the NA of the test optical system is 0.86, the wavelength λ is 248 nm, the illumination light is non-polarized light, the effective light source is a partially coherent light source of σ of 0.7 as illustrated in FIG. 3A, and the aberration is estimated from images defocused by ±400 nm.

Figure 8:
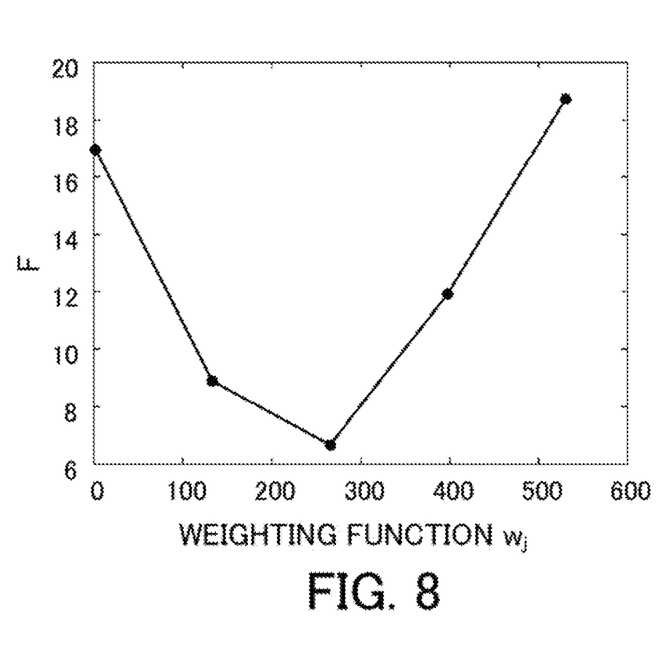
FIG. 8 is a diagram illustrating a relation between a weighting function $w_j$ and an evaluation function F according to a third embodiment.

FIG. 8 is obtained when the evaluation function F of Expression 1 is plotted on a graph from five types of $w_j$ during the $k^{th}$ iterative calculation using the steepest descent method. The abscissa axis is a value of a weighting function, and the ordinate axis is a value of an evaluation function. When the evaluation function F obtained based upon the five types of $w_j$ is approximated to a quadratic function, an extreme value is about 250. Thus, the optimal $w_j$ can be determined to be 250 in the $k^{th}$ iterative calculation. When the above procedure is repeated for all iterative calculations, the optimal weighting function $w_j$ can be determined at each iterative calculation, and the convergence of the steepest descent method can be expedited. In other words, the weighting function is a function of k in addition to j.

Fourth Embodiment

In implementing the embodiment, a plurality of parameters may be changed. For example, the NA and illumination shape are also parameters, and are not easily changed. On the other hand, a defocus position used to obtain the image, and the number of obtained images may be easily changed. In this embodiment, a change of an aberration estimation accuracy is examined which depends upon the defocus position used to obtain the image and the number of obtained images.

Assume that the NA of the test optical system is 0.86, the wavelength λ is 248 nm, the illumination light is non-polarized light, and the effective light source is a partially coherent light source with σ of 0.2.

FIGS. 9A to 9D are results of examining a change of an aberration estimation accuracy depending upon the defocus position used to obtain the image (abscissa axis) and the pinhole size (ordinate axis). A size d (diameter d for a circular aperture, and a length of a side for a rectangular aperture) of the pinhole is changed from 0.25λ/NA to 1.50λ/NA. In addition, the following expression is used as a unit quantity of the defocus.

$$R.U. = \frac{1}{2}\frac{\lambda}{2}\frac{1}{\sqrt{1-NA^2}} \qquad \text{EXPRESSION 27}$$

A differential norm of an optical image calculated without an aberration and a measured optical image is set to 100, and a differential norm of the optical image obtained with 50 loops of the steepest descent method and the measured optical image is examined.

Figure 9A:
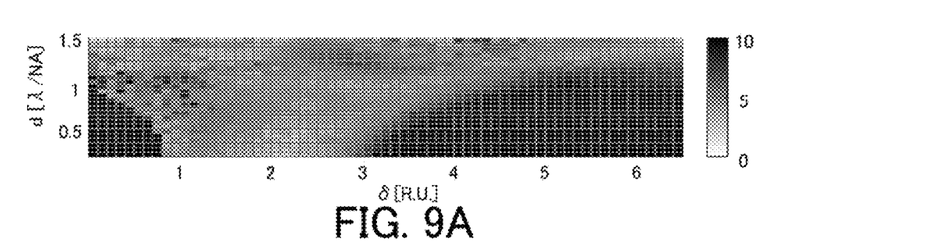
FIGS. 9A-9D are diagrams illustrating a relationship between a defocus position at which an image is acquired and an aberration estimating accuracy corresponding to a pinhole side according to a fourth embodiment.

Initially, assume an aberration is estimated from one optical image. When a defocus amount δ in obtaining the image is changed from 0.1 R.U. to 6.5 R.U., a result of FIG. 9A is obtained.

Figure 9B:
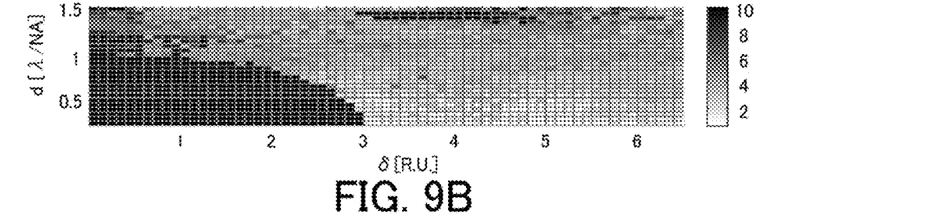

Next assume that an aberration is estimated from two optical images. Defocus positions used to obtain an image are set to −0.5δ and 0.5δ, and δ is changed from 0.1 R.U. to 6.5 R.U. FIG. 9B illustrates an aberration estimation accuracy.

Figure 9C:
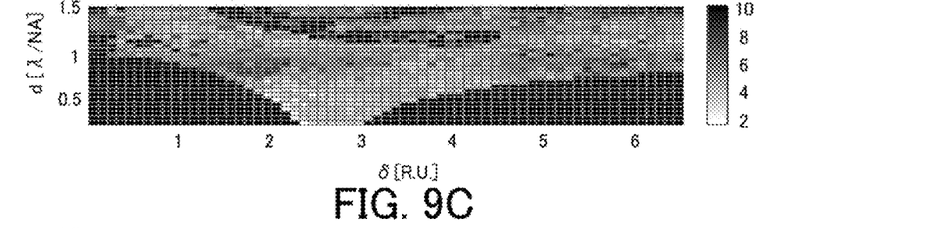

When an aberration is estimated from three optical images, the three images are acquired from positions of −1.0δ, 0, and 1.0δ, and δ is changed from 0.1 R.U. to 6.5 R.U. FIG. 9C illustrates an aberration estimation accuracy.

Figure 9D:
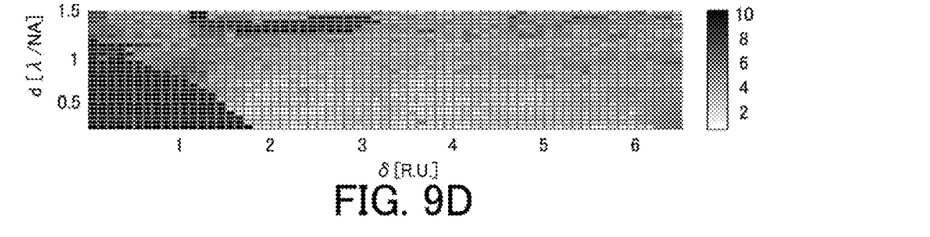

Finally, when an aberration is estimated from four optical images, the four images are acquired at positions of −1.5δ, −0.5δ, 0.5δ, and 1.5δ, and δ is changed from 0.1 R.U. to 6.5 R.U. FIG. 9D illustrates an aberration estimation accuracy.

Each result of FIGS. 9A to 9D indicates that a solution is difficult to converge in a region which is almost black. A common tendency is that an aberration estimation accuracy is low when a pinhole size is small and a defocus amount δ is small, because an aberration rarely influences an image near the best focus.

Four images or less are preferred when the practical processing time is considered. The following condition is derived from FIG. 9D so as to precisely estimate the aberration with four or less images. Assume that d' (=dNA/λ) is obtained by normalizing a pinhole size d by λ/NA is set, and $δ'_i$ (=$δ_i$/R.U.) is obtained by normalizing defocus positions $δ_i$ (1≤i≤4) used to obtain the four images by R.U. of Expression 27. Then, the following Expression may be established at a minimum of $δ'_i$. In other words, in this case, the first image is formed from "i" images taken at "i" types of positions having defocus amounts $δ_i$. The aberration can be precisely estimated when the condition of Expression 28 is satisfied:

$$d'^2 + \frac{δ'^2_i}{2^2} \geq 1 \qquad \text{EXPRESSION 28}$$

Since the aberration varies according to an image height (or a field position at a position in an image-pickup region) in a microscope and the like, the aberration at each image height can be obtained when the aberration estimating method is performed by disposing a pinhole at each image height. For this purpose, a light shielding object such as chrome may be deposited on a glass slide, and a pinhole may be formed by etching processing and the like at an image height at which an aberration is to be measured. When there are M image heights for each of which the aberration is to be measured, M pinholes are formed at these positions, and the aberration estimating method may be performed using optical images at the M image heights. In this way, the aberration can be found at a predetermined image height.

The invention is applicable to an application for measuring the aberration of the test optical system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-201462, filed Sep. 13, 2012, which is hereby incorporated by reference herein in its entirety.

What is claimed is:

1. An aberration estimating method using a steepest descent method, the aberration estimating method configured to estimate, as an aberration of a test optical system, an aberration when an evaluation function becomes less than or equal to a permissible value, the evaluation function being expressed by a square sum of a difference between a first image acquired by photoelectrically converting an optical image of an object formed by the test optical system and a second image estimated when the aberration is provided to the test optical system, the aberration estimating method comprising the step of:

updating the aberration with a sum of a current aberration and a first derivative of the evaluation function by the aberration when the evaluation function is larger than the permissible value, wherein the aberration is an aberration of an entire pupil plane of the test optical system, and wherein the updating step includes calculating the first derivative by Fourier-transforming the difference instead of an integration at coordinates of respective points on an image plane of the test optical system.

2. The aberration estimating method according to claim 1, wherein the second image is expressed by the following expression:

$$I(x, y, z_j, \phi) = \sum_{l=1}^{L'} \lambda_l |FT[\Phi_l(f, g)e^{-i\phi(f,g)}]|^2$$

where $I(x, y, z_j, \phi)$ is the second image estimated when an aberration $\phi(f, g)$ is applied to the test optical system, $(x, y)$ is a coordinate for an object plane and the image plane of the test optical system, $z_j$ is a $j^{th}$ focus position, $(f, g)$ is a coordinate for a light source plane configured to illuminate the object and the pupil plane of the test optical system and is normalized so that a radius of a pupil is 1, FT is a Fourier transform, L' is a natural number less than or equal to L, L is a number of point light sources configured to illuminate the object, $a(f, g)$ is a Fourier transform of a complex amplitude transmittance of an object, $S(f, g)$ is an effective light source, $\Phi_l(f, g)$ is an eigenfunction given below, * is a complex conjugate, $\lambda_l$ is an eigenvalue given below, and c(r) is a function having a value 0 for r>1 and a value 1 otherwise:

$$\int\int S(f, g)c(\sqrt{f^2+g^2})a^*(f_1-f, g_1-g)a(f_2-f, g_2-g)dfdg = \sum_{l=1}^{L'} \lambda_l \Phi_l^*(f_1, g_1)\Phi_l(f_2, g_2).$$

3. The aberration estimating method according to claim 1, further comprising the step of performing phase unwrap for the aberration updated by the updating step.

4. The aberration estimating method according to claim 1, wherein the object is illuminated by a partially coherent illumination formed by a plurality of point light sources, and wherein the updating step includes calculating the first derivative as a sum with respect to the respective light sources.

5. The aberration estimating method according to claim 1, wherein the evaluation function is expressed by the following expression:

$$F = \sum_{j=1}^{J} \sum_{x,y} w_j |I_t(x, y, z_j) - I(x, y, z_j, \phi)|^2$$

where F is the evaluation function, $I_t(x, y, z_j)$ is the first image, $(x, y)$ is a coordinate for an object plane and the image plane of the test optical system, $z_j$ is a $j^{th}$ focus position, J is the number of first or second images acquired by changing a defocus amount, $I(x, y, z_j, \phi)$ is the second image estimated when $\phi(f, g)$ is applied to the test optical system, $(f, g)$ is a coordinate for a light source plane configured to illuminate the object and the pupil plane of the test optical system and is normalized so that a radius of a pupil is 1, and $w_j$ is a weighting function, wherein the updating step includes updating the aberration as below:

$$\phi^{k+1}(f, g) = \phi^k(f, g) + \sum_j w_j \frac{\partial F_j}{\partial \phi}$$

where $\phi^{k+1}(f,g)$ is a $(k+1)^{th}$ aberration, $\phi^k(f, g)$ is a $k^{th}$ aberration, and $\partial F_j/\partial \phi$ is the first derivative of the evaluation function, wherein $k^{th}$ and $(k+1)^{th}$ weighting functions are changed.

6. The aberration estimating method according to claim 5, wherein in a $k^{th}$ iterative calculation, the difference is calculated using at least three types of weighting functions, the difference is fitted as a quadratic function of the weighting function, and an extreme value of the quadratic function is set to the $k^{th}$ weighting function.

7. The aberration estimating method according to claim 1, wherein the first image is formed based upon a plurality of images captured at a plurality of positions containing defocus amounts having the same absolute value and different signs.

8. The aberration estimating method according to claim 1, wherein the object is a mask including a circular light-transmitting area having a radius less than or equal to 0.5λ/NA in a light-shielding part, where λ is an average wavelength of illumination light, and NA is an image-side numerical aperture of the test optical system.

9. The aberration estimating method according to claim 1, wherein the object is a mask including a rectangular light-transmitting area whose side has a length less than or equal to λ/NA in a light-shielding part, where λ is an average wavelength of illumination light, and NA is an image-side numerical aperture of the test optical system.

10. The aberration estimating method according to claim 1, wherein the object is a mask including a circular light-transmitting area having a diameter d in a light-shielding part, wherein the first image is formed based upon i images captured at i types of positions having defocus amounts $\delta_i$, and wherein where d' is obtained by normalizing d by λ/NA and $\lambda'_i$ is obtained by normalizing $\delta_i$ by R.U., the following expression is established for a minimum of $\delta'_i$:

$$d'^2 + \frac{\delta_i'^2}{2^2} \geq 1$$

where λ is an average wavelength of illumination light, NA is an image-side numerical aperture of the test optical system, and R.U. is given by the following expression:

$$R.U. = \frac{1}{2}\frac{\lambda}{2}\frac{1}{\sqrt{1-NA^2}}.$$

11. The aberration estimating method according to claim 1, wherein the object is a mask including a rectangular light-transmitting area whose side has a length d in a light-shielding part, wherein the first image is formed based upon i images captured at i types of positions having defocus amounts $\delta_i$, and wherein where d' is obtained by normalizing d by $\lambda$/NA and $\delta'_i$ is obtained by normalizing $\delta_i$ by R.U., the following expression is established for a minimum of $\delta'_i$:

$$d'^2 + \frac{\delta'^2_i}{2^2} \geq 1$$

where $\lambda$ is an average wavelength of illumination light, NA is an image-side numerical aperture of the test optical system, and R.U. is given by the following expression:

$$R.U. = \frac{1}{2}\frac{\lambda}{2}\frac{1}{\sqrt{1-NA^2}}.$$

12. The aberration estimating method according to claim 1, wherein by using the first image and the second image acquired by disposing the object at each of a plurality of image heights of the test optical system, the aberration of the test optical system at each image height is estimated.

13. The aberration estimating method according to claim 1, wherein light illuminating an object is polarized light, and the second image is expressed using three types of pupil functions of a pupil function corresponding to an x polarized light component, a pupil function corresponding to a y polarized light component, and a pupil function corresponding to a z polarized light component, and (x, y, z) is a coordinate for an object space and the image space of the test optical system.

14. A non-transitory tangible media storing a program that enables a computer to execute an aberration estimating method using a steepest descent method, the aberration estimating method configured to estimate, as an aberration of a test optical system, an aberration when an evaluation function becomes less than or equal to a permissible value, the evaluation function being expressed by a square sum of a difference between a first image acquired by photoelectrically converting an optical image of an object formed by the test optical system and a second image estimated when the aberration is provided to the test optical system, wherein the computer updates the aberration with a sum of a current aberration and a first derivative of the evaluation function by the aberration when the evaluation function is larger than the permissible value, wherein the aberration is an aberration of an entire pupil plane of the test optical system, and wherein the computer calculates the first derivative by Fourier-transforming the difference instead of an integration at coordinates of respective points on an image plane of the test optical system.

15. An image-pickup apparatus comprising:

a test optical system configured to form an optical image of an object;

an image sensor configured to photoelectrically convert the optical image formed by the test optical system; and a computer configured to use a steepest descent method and to estimate, as an aberration of a test optical system, an aberration when an evaluation function becomes less than or equal to a permissible value, the evaluation function being expressed by a square sum of a difference between a first image acquired by photoelectrically converting an optical image of an object formed by the test optical system and a second image estimated when the aberration is provided to the test optical system, wherein the computer updates the aberration with a sum of a current aberration and a first derivative of the evaluation function by the aberration when the evaluation function is larger than the permissible value, wherein the aberration is an aberration of an entire pupil plane of the test optical system, and wherein the computer calculates the first derivative by Fourier-transforming the difference instead of an integration at coordinates of respective points on an image plane of the test optical system.

16. The image-pickup apparatus according to claim 15, wherein the image-pickup apparatus is a digital microscope.

* * * * *